(12) United States Patent
Vashchenko

(10) Patent No.: US 7,910,951 B2
(45) Date of Patent: Mar. 22, 2011

(54) LOW SIDE ZENER REFERENCE VOLTAGE EXTENDED DRAIN SCR CLAMPS

(75) Inventor: Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 184 days.

(21) Appl. No.: 12/214,392

(22) Filed: Jun. 18, 2008

(65) Prior Publication Data
US 2009/0315113 A1 Dec. 24, 2009

(51) Int. Cl.
*H01L 29/66* (2006.01)
*H01L 23/62* (2006.01)

(52) U.S. Cl. .............. 257/175; 257/357; 257/E23.001

(58) Field of Classification Search .............. 257/355, 257/E23.001, 119, 173, 175, 356–363
See application file for complete search history.

(56) References Cited

U.S. PATENT DOCUMENTS

| | | | | |
|---|---|---|---|---|
| 5,416,351 A * | 5/1995 | Ito et al. | ......... | 257/357 |
| 5,932,914 A * | 8/1999 | Horiguchi | ......... | 257/355 |
| 6,051,457 A * | 4/2000 | Ito | ......... | 438/208 |
| 6,266,222 B1 * | 7/2001 | Colombo et al. | ......... | 361/111 |
| 6,320,232 B1 * | 11/2001 | Gossner et al. | ......... | 257/360 |
| 6,455,902 B1 * | 9/2002 | Voldman | ......... | 257/378 |
| 6,645,802 B1 * | 11/2003 | Li et al. | ......... | 438/237 |
| 6,696,731 B2 * | 2/2004 | Mallikarjunaswamy | ......... | 257/362 |
| 7,067,887 B2 * | 6/2006 | Chang et al. | ......... | 257/360 |
| 7,583,485 B1 * | 9/2009 | Luo et al. | ......... | 361/56 |
| 7,701,012 B2 * | 4/2010 | Xu et al. | ......... | 257/355 |
| 2004/0207020 A1 * | 10/2004 | Chen et al. | ......... | 257/355 |
| 2005/0045909 A1 * | 3/2005 | Zhang | ......... | 257/173 |
| 2005/0247979 A1 * | 11/2005 | Fung | ......... | 257/355 |
| 2005/0280092 A1 * | 12/2005 | Cheng et al. | ......... | 257/355 |
| 2008/0112204 A1 * | 5/2008 | Mallikararjunaswamy | ......... | 365/94 |
| 2008/0277728 A1 * | 11/2008 | Huang | ......... | 257/357 |
| 2009/0230426 A1 * | 9/2009 | Carpenter et al. | ......... | 257/173 |

* cited by examiner

*Primary Examiner* — Lex Malsawma
(74) *Attorney, Agent, or Firm* — Jurgen K. Vollrath

(57) ABSTRACT

In a CMOS implemented free or parasitic pnp transistor, triggering is controlled by introducing a low side zener reference voltage.

11 Claims, 2 Drawing Sheets

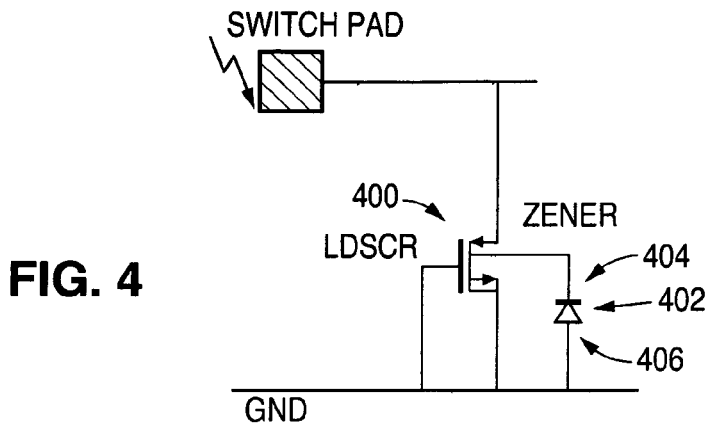
FIG. 4
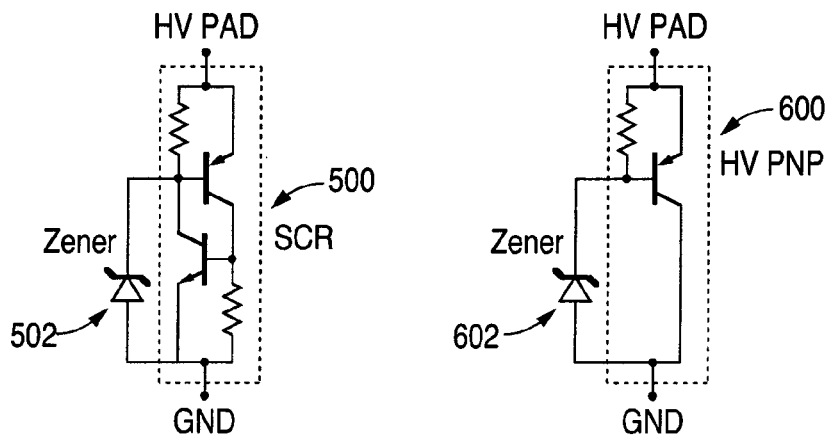
FIG. 5  FIG. 6
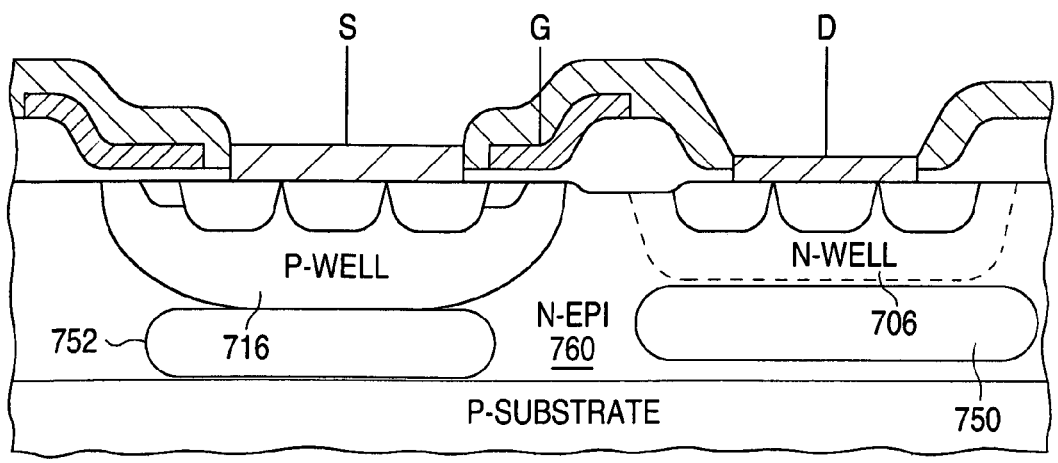
FIG. 7

US 7,910,951 B2

LOW SIDE ZENER REFERENCE VOLTAGE EXTENDED DRAIN SCR CLAMPS

FIELD OF THE INVENTION

The invention relates to high voltage devices. In particular it relates to power arrays of high voltage MOS devices.

BACKGROUND OF THE INVENTION

Power arrays of high voltage devices are commonly used in dc-dc magnetic converters. These high voltage devices are, for instance, implemented as Lateral DMOS (LDMOS) (which is a self-aligned device implemented in a BiCMOS process) or as drain-extended MOS (DeMOS) (which is a non-self-aligned device implemented in a CMOS process). For purposes of this application the term CMOS will be used to also cover BiCMOS. FIG. 1 shows a cross section through a typical NLDMOS-SCR 100, which broadly speaking comprises an LDMOS having one or more p+ regions 102 which are connected to the drain defined by n+ region 104 to provide for double injection of charge carriers. The n+ drain 104 is formed in an n-well or n-drift region 106, which in this case is formed in an n-epitaxial region 108 formed in or on a p-substrate 110. The device 100 further includes an n+ source 114 formed in a p-body or p-well 116, which is formed in the n-epi 108. In this embodiment the NLDMOS SCR 100 further includes a p+ backgate 118 formed in the p-well 116. A polysilicon gate 120, which is formed over a gate oxide 122 and a field oxide (FOX) 124, is provided between the drain contact 130 and source contact 128, this region between the contacts defining the active region. For convenience during fabrication the p+ region 102 may be self aligned with the FOX region 124.

The p+ region 102, n-well or n-drift 106, and p+ region 108 define a parasitic pnp transistor in the NLDMOS-SCR, wherein the base of the parasitic pnp is defined by the n-drift 106. A parasitic npn is in turn defined by the n+ source 114 (which defines the emitter of the parasitic NPN and is typically tied to ground), p-well 116 (which forms the base of the parasitic npn) and n+ drain 104, which forms the collector of the parasitic npn It will be appreciated that ESD devices have to be designed to tolerate the required dc levels during normal operation as well as the triggering voltage range during an ESD event. In the case of switching or noisy high voltage nodes this creates a problem. Controlling the triggering voltage by dynamically coupling the control electrode of the clamp, e.g. by connecting the gate of an LDSCR clamp 200 to ground through a resistor 202 (as shown in FIG. 2), can cause unpredictable triggering under different loads.

One solution that has been proposed in the past is the use of a fixed voltage reference such as a zener diode 300 to control the control electrode, as shown in FIG. 3. This keeps the triggering voltage consistent under different loads. However, as is shown in FIG. 3, the Zener diode 300 in this example is tied between the switch pad 302 and the gate of the LDSCR 304. Thus the zener 300 is tied to a high voltage and provides its voltage reference to the gate with respect to this high voltage. This solution is suitable for BiCMOS processes where the substrate is isolated with proper HV tolerance, but not for CMOS processes with their low breakdown voltage.

In the case of CMOS processes the breakdown voltage of the Deep n-well or n-epi to p-well is relatively low. For example in the CMOS7-5V 40V and C9T5V processes of the present applicant the breakdown is below 40V. Thus the use of a high side Zener diode as a reference for the gate of the CMOS device would not work.

The present invention seeks to provide a solution to overcome these process limitations.

SUMMARY OF THE INVENTION

According to the invention, there is provided an ESD protection device that includes at least one of a free or parasitic pnp transistor and a free or parasitic npn transistor implemented in a CMOS process, and at least one of a zener diode connected with its n-type region to the n-type region of the pnp transistor and with its p-type region either directly or indirectly to ground, and a zener diode connected with its p-type region to the p-type region of the npn transistor. In the case of an SCR device with a parasitic pnp transistor, the n-type region of the parasitic pnp transistor is typically defined by an n-well or n-drift region connected to the pad and defining the base of the parasitic pnp transistor. Further, in the case of an SCR device with a parasitic npn the p-type region of the parasitic npn transistor is typically defined by a p-well connected to ground [PLEASE CONFIRM]

Further, according to the invention, there is provided a method of controlling the triggering voltage of a free or parasitic pnp transistor implemented in a CMOS process, comprising opening the base-emitter junction of the pnp transistor by injecting current into the base of the pnp transistor using a zener diode connected between the base and ground. The n-type region of the zener diode is typically connected to the base of the pnp transistor and the p-type region of the zener diode is typically connected directly or indirectly to ground. The pnp transistor may be a parasitic transistor in an NLDMOS-SCR or lateral SCR or may be a free bipolar transistor. The cathode of the zener diode may be defined by the base of the pnp transistor.

Still further, according to the invention, there is provided a method of controlling the triggering voltage of a free or parasitic npn transistor implemented in a CMOS process, comprising opening the base-emitter junction of the npn transistor by injecting current into the base using a zener connected between the base and a pad. Typically the p-type region of the zener diode is connected to the base of the npn transistor and the p-type region of the zener diode to directly or indirectly to the pad. The npn transistor may be a parasitic transistor in an NLDMOS-SCR or lateral SCR or may be a free bipolar transistor. The anode of the zener diode may be integrated into the circuit and may be defined by the base of the npn transistor.

BRIEF DESCRIPTION OF THE DRAWINGS

FIG. 4 is a schematic circuit diagram of one embodiment of the invention implemented for an NLDMOS-SCR that is implemented in a CMOS process, FIG. 5 is a schematic circuit diagram of another embodiment of the invention implemented for a lateral SCR that is implemented in a CMOS process, and FIG. 6 is a schematic circuit diagram of yet another embodiment of the invention implemented for a PNP clamp that is implemented in a CMOS process, and FIG. 7 is a sectional view through an NLDMOS-SCR with zeners connected to both the parasitic pnp and npn transistors of the SCR in accordance with one embodiment of the invention.

DETAILED DESCRIPTION OF THE INVENTION

FIGS. 4 to 6 show schematic circuit diagrams of different embodiments of the invention, involving the use of a low side zener diode as reference voltage.

Figure 1:
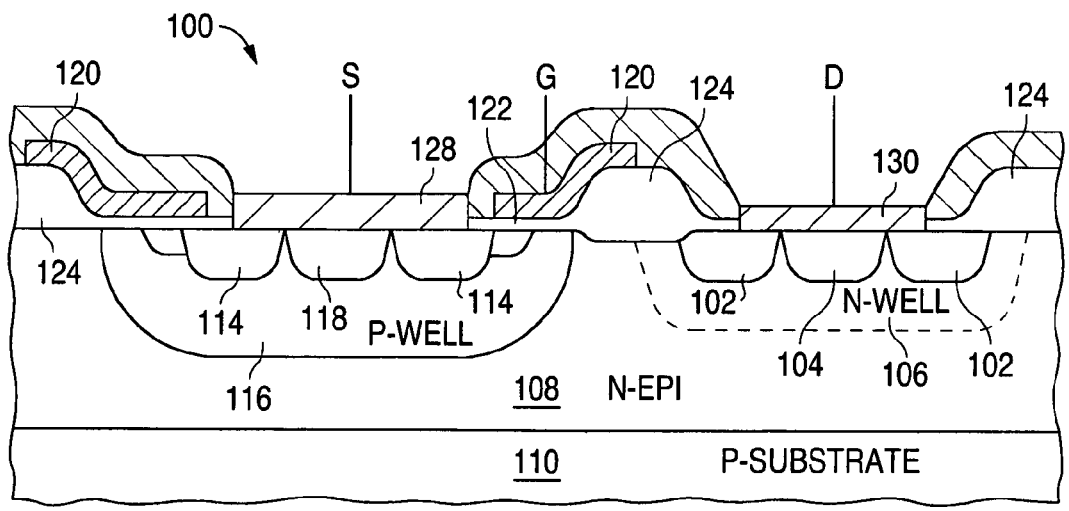
FIG. 1 is a sectional view through a typical NLDMOS-SCR as known in the art.
Figure 2:
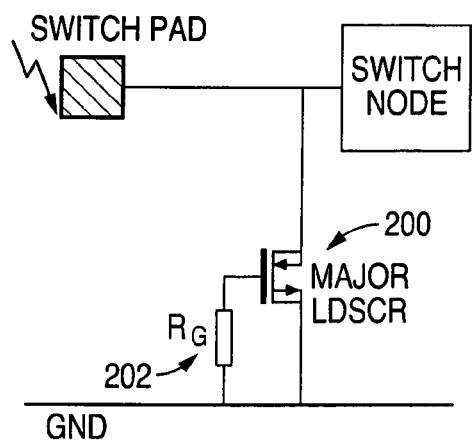
FIG. 2 is a schematic circuit diagram of a prior art ESD solution implemented in a BiCMOS process.
Figure 3:
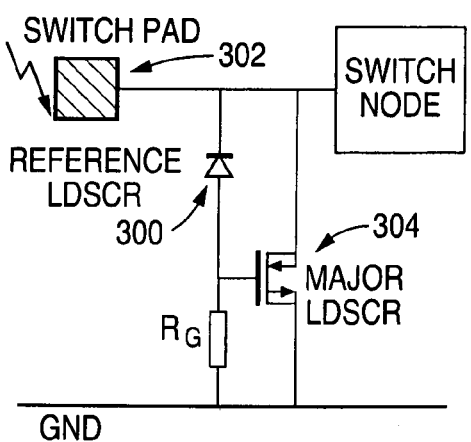
FIG. 3 is a schematic circuit diagram of another prior art ESD solution implemented in a BiCMOS process.

In FIG. 4, an NLDMOS-SCR 400 is shown that makes use of gate reduced surface electric field (gate RESURF) and is implemented in a CMOS process. A zener diode 402 comprising a high voltage n-region 404 and a low voltage p-region 400 (shown in FIG. 4 by the connection to ground) is used to create the turn-on of the parasitic PNP in the NLDMOS-SCR clamp 400. The p-emitter of the parasitic PNP in the NLDMOS-SCR (see for example region 102 in FIG. 1) is connected directly to the pad while the n-drift (e.g., region 106 in FIG. 1) is connected to the high voltage n-region 404 (n-drift) of the zener diode 402. The zener diode 402 can be provided as an external zener or can be integrated into the circuit as shown in FIG. 7. The embodiment shown in FIG. 7 shows two implementations of a vertical zener diode integrated into the circuit. In the one implementation the zener is defined by the n-well or n-drift region 706 and a p-buried layer (PBL) 750 that is formed underneath the n-well 706. In effect the zener is therefore connected with its cathode to the base of the parasitic pnp (n-drift region 706) since region 706 also defines the cathode of the zener diode. In the other implementation a zener is defined by the p-body or p-well 716 and an n-buried layer (NBL) 752 formed underneath the p-well 716. It will be appreciated that the NBL is connected to the drain through the n-epi 760. In this embodiment the p-body contact is disconnected from the source to define an additional control electrode. Since p-well 716 forms both the anode of the zener diode as well as the base of the parasitic npn, the anode of the zener is in effect connected to the base of the parasitic npn (p-body 716). Thus, as shown in FIG. 7, in the first embodiment a deep p-type implant 750 is added to define the anode of the diode, the cathode being defined by the n-drift region 706. In the second embodiment a deep n-type implant 752 is added to define the cathode of the zener diode, the anode being defined by the p-well 716.

Thus, as the pad voltage increases above the breakdown voltage of the zener diode 402, the base-emitter junction of the parasitic pnp transistor is opened and the injection of charge carriers begins followed by the double injection conductivity modulation in the SCR.

Similarly, when the zener connected to the p-base of the parasitic npn breaks down, charge is injected into the p-base to turn on the npn.

The embodiment of FIG. 5 shows the invention implemented using a lateral SCR 500. Again, a zener diode 502 is used to create the turn-on of the upper parasitic PNP in the SCR. In particular, the zener 502 is connected with its n-region to the n-region of the parasitic pnp in the lateral SCR 500, and thus also involves the use of a low side zener diode.

The embodiment of FIG. 6 makes use of a high-voltage free pnp bipolar transistor 600 which, like the parasitic pnp transistors in the embodiments of FIGS. 5 and 6, is controlled by a low side zener diode 602 to control its turn-on by having the high voltage n-region of the zener diode 602 connected to the n-base of the pnp transistor

What is claimed is:

1. an ESD protection device, comprising:
    a drain region formed in an n-well;
    a source region formed in a p-well;
    at least one of a p-buried layer formed beneath the n-well, and an n-buried layer formed beneath the p-well;
    at least one of a free or parasitic pnp transistor and a free or parasitic npn transistor implemented in a CMOS process; and
    at least one of a vertical zener diode defined by the n-type region of the pnp transistor and the p-buried layer, and a vertical zener diode defined by the p-type region of the npn transistor and the n-buried layer.

2. An ESD protection device of claim 1, wherein the device includes an SCR device defining a parasitic pnp transistor, the n-type region of the parasitic pnp transistor being defined by an n-well or n-drift region connected to a pad.

3. An ESD protection device of claim 1, wherein the device includes an SCR device defining a parasitic npn transistor, the p-type region of the parasitic npn transistor being defined by a p-well connected to ground.

4. An ESD protection device of claim 2, wherein the device includes an SCR device defining a parasitic npn transistor, the p-type region of the parasitic npn transistor being defined by a p-well connected to ground.

5. An ESD protection device of claim 1, wherein the device includes a free pnp transistor, the base of which is connected to a zener diode having its anode connected directly or indirectly to ground.

6. A method of controlling the triggering voltage of a free or parasitic pnp transistor implemented in a CMOS process in an ESD protection device that includes a drain region formed in an n-well; a source region formed in a p-well; and a p-buried layer formed beneath the n-well, the method comprising;
    opening the base-emitter junction of the pnp transistor by injecting current into the base of the pnp transistor using a zener diode defined by the base and the underlying p-buried layer.

7. A method of claim 6, wherein the pnp transistor is a parasitic transistor in an NLDMOS-SCR or lateral SCR.

8. A method of claim 6, wherein the pnp transistor is a free bipolar transistor.

9. A method of controlling the triggering voltage of a free or parasitic npn transistor implemented in a CMOS process in an ESD protection device that includes a drain region formed in an n-well; a source region formed in a p-well; and an n-buried layer formed beneath the p-well, the method comprising;
    opening the base-emitter junction of the npn transistor by injecting current into the base of the npn transistor using a zener defined by the base and the underlying n-buried layer.

10. A method of claim 9, wherein the npn transistor is a parasitic transistor in an NLDMOS-SCR or lateral SCR.

11. A method of claim 9, wherein the npn transistor is a free bipolar transistor.

* * * * *